(12) United States Patent
Darwish et al.

(10) Patent No.: US 8,080,848 B2
(45) Date of Patent: Dec. 20, 2011

(54) HIGH VOLTAGE SEMICONDUCTOR DEVICE WITH LATERAL SERIES CAPACITIVE STRUCTURE

(75) Inventors: Mohamed N. Darwish, Campbell, CA (US); Robert Kuo-Chang Yang, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 494 days.

(21) Appl. No.: 11/801,819

(22) Filed: May 10, 2007

(65) Prior Publication Data
US 2007/0262398 A1    Nov. 15, 2007

Related U.S. Application Data

(60) Provisional application No. 60/799,781, filed on May 11, 2006.

(51) Int. Cl.
*H01L 29/78* (2006.01)
*H01L 21/336* (2006.01)
(52) U.S. Cl. . 257/343; 438/257; 438/283; 257/E29.256; 257/E21.442
(58) Field of Classification Search .................. 257/492, 257/339, 342–343
See application file for complete search history.

(56) References Cited

U.S. PATENT DOCUMENTS

| | | | |
|---|---|---|---|
| 5,075,739 A | 12/1991 | Davies | |
| 5,111,254 A * | 5/1992 | Levinson et al. | 257/261 |
| 5,204,545 A | 4/1993 | Terashima | |
| 5,334,546 A * | 8/1994 | Terashima | 438/454 |
| 6,037,632 A | 3/2000 | Omura et al. | |
| 6,110,804 A | 8/2000 | Parthasarathy et al. | |
| 6,190,948 B1 | 2/2001 | Seok | |
| 6,310,378 B1 | 10/2001 | Letavic et al. | |
| 6,353,252 B1 | 3/2002 | Yasuhara et al. | |
| 6,576,973 B2 | 6/2003 | Collard et al. | |
| 6,590,240 B1 | 7/2003 | Lanois | |

(Continued)

FOREIGN PATENT DOCUMENTS
EP        20164 A1   12/1990
(Continued)

OTHER PUBLICATIONS

Chen et al. "Optimization of the specific on-resistance of the COOLMOS™,"IEEE Transactions on Electron Devices 48:344-348 (Feb. 2001).

(Continued)

*Primary Examiner* — Matthew W Such
*Assistant Examiner* — Ali Naraghi
(74) *Attorney, Agent, or Firm* — Kilpatrick Townsend & Stockton LLP

(57) ABSTRACT

According to the present invention, semiconductor device breakdown voltage can be increased by embedding field shaping regions within a drift region of the semiconductor device. A controllable current path extends between two device terminals on the top surface of a planar substrate, and the controllable current path includes the drift region. Each field shaping region includes two or more electrically conductive regions that are electrically insulated from each other, and which are capacitively coupled to each other to form a voltage divider dividing a potential between the first and second terminals. One or more of the electrically conductive regions are isolated from any external electrical contact. Such field shaping regions can provide enhanced electric field uniformity in current-carrying parts of the drift region, thereby increasing device breakdown voltage.

11 Claims, 8 Drawing Sheets

U.S. PATENT DOCUMENTS

| | | | |
|---|---|---|---|
| 6,717,230 B2 * | 4/2004 | Kocon | 257/487 |
| 6,750,506 B2 | 6/2004 | Noda et al. | |
| 6,873,011 B1 | 3/2005 | Huang et al. | |
| 6,879,005 B2 | 4/2005 | Yamaguchi et al. | |
| 6,897,133 B2 | 5/2005 | Collard | |
| 6,903,413 B2 | 6/2005 | Lanois | |
| 6,903,421 B1 | 6/2005 | Huang et al. | |
| 6,989,566 B2 | 1/2006 | Noda et al. | |
| 6,995,428 B2 | 2/2006 | Huang et al. | |
| 7,033,891 B2 * | 4/2006 | Wilson et al. | 438/270 |
| 7,078,783 B2 | 7/2006 | Lanois | |
| 7,101,739 B2 | 9/2006 | Lanois | |
| 7,208,385 B2 | 4/2007 | Hossain et al. | |
| 7,282,765 B2 * | 10/2007 | Xu et al. | 257/343 |
| 7,535,057 B2 * | 5/2009 | Yang | 257/335 |
| 2002/0105007 A1 | 8/2002 | Saggio et al. | |
| 2002/0130358 A1 | 9/2002 | Van Dalen et al. | |
| 2003/0232477 A1 | 12/2003 | Deboy et al. | |
| 2004/0164304 A1 | 8/2004 | Magri et al. | |
| 2005/0127434 A1 | 6/2005 | Quoirin et al. | |
| 2005/0133858 A1 | 6/2005 | Banerjee et al. | |
| 2005/0136613 A1 | 6/2005 | Poveda | |
| 2006/0118833 A1 | 6/2006 | Lanois | |
| 2006/0138450 A1 | 6/2006 | Lanois et al. | |
| 2006/0157745 A1 | 7/2006 | Lanois | |
| 2006/0205196 A1 | 9/2006 | Lanois | |
| 2006/0255401 A1 * | 11/2006 | Yang et al. | 257/328 |
| 2006/0267044 A1 | 11/2006 | Yang | |
| 2007/0052060 A1 | 3/2007 | Yang | |
| 2007/0102725 A1 | 5/2007 | Magri' et al. | |
| 2007/0176229 A1 | 8/2007 | Willmeroth et al. | |
| 2007/0187781 A1 * | 8/2007 | Kocon | 257/408 |

FOREIGN PATENT DOCUMENTS

| | | |
|---|---|---|
| EP | 1073123 A2 | 1/2001 |
| EP | 1111683 A2 | 6/2001 |
| JP | 62-173764 A | 7/1987 |
| JP | 63-296282 A | 12/1988 |
| JP | 09-181109 A | 7/1997 |
| JP | 2001-237423 A | 8/2001 |
| JP | 2002-299622 A | 10/2002 |
| WO | WO 01/59846 | 8/2001 |

* cited by examiner

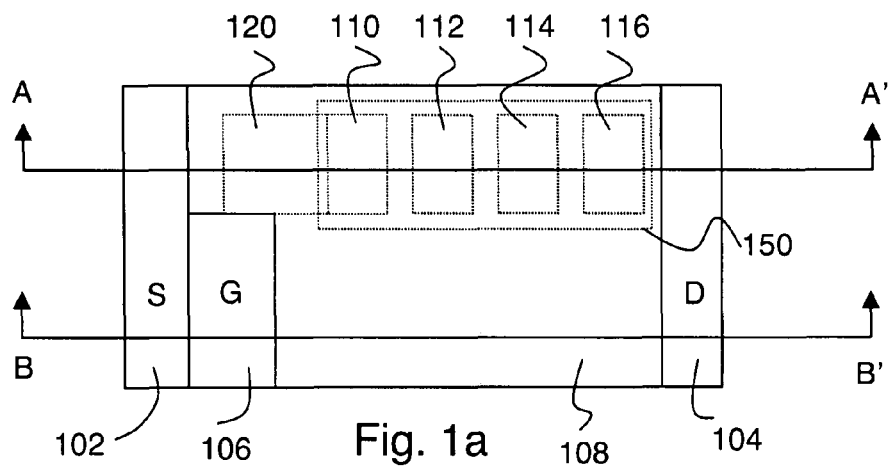
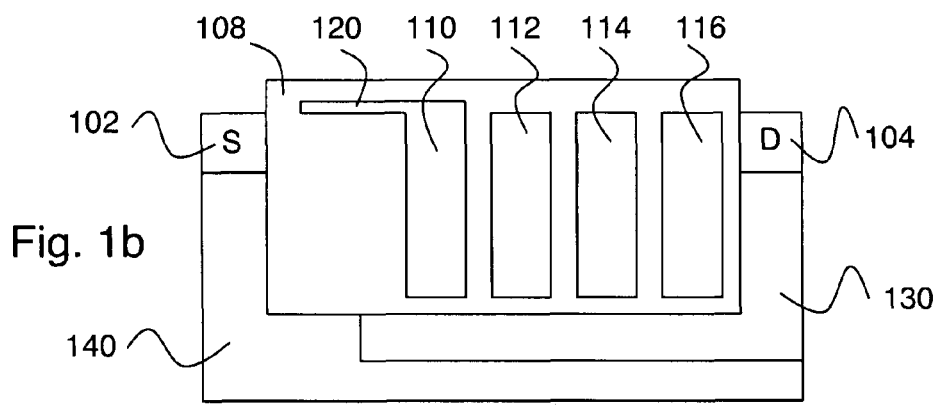
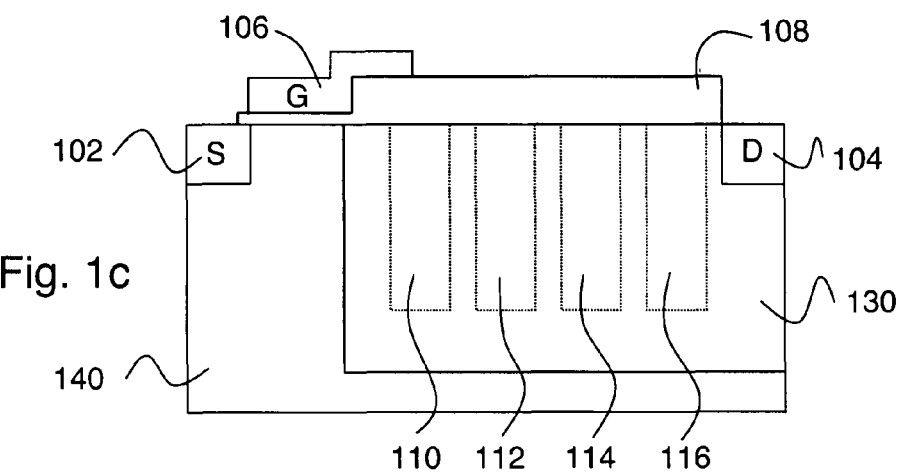

US 8,080,848 B2

HIGH VOLTAGE SEMICONDUCTOR DEVICE WITH LATERAL SERIES CAPACITIVE STRUCTURE

CROSS REFERENCE TO RELATED APPLICATIONS

This application claims the benefit of U.S. provisional patent application 60/799,781, filed on May 11, 2006, entitled "High voltage semiconductor device with lateral series capacitive structure", and hereby incorporated by reference in its entirety.

FIELD OF THE INVENTION

This invention relates to high voltage semiconductor devices.

BACKGROUND

The breakdown voltage of a semiconductor device is significantly affected by the electric field distribution within and near the device. Accordingly, methods of increasing device breakdown voltage by altering or controlling the electric field distribution have been extensively developed in the art, and are often referred to as field shaping methods. Structures employed for field shaping include guard rings, floating field plates, and biased charge control electrodes.

For example, in U.S. Pat. No. 6,190,948, field shaping between an active region of a device and a floating field ring around the device is provided by several overlapping floating field plates between the active region and the field ring. The overlap of the field plates increases the capacitive coupling between the plates. In this example, field shaping is provided in a termination region of the device.

Field shaping has also been employed within devices (e.g., between the source and drain of a field effect transistor (FET)) to increase breakdown voltage. For example, in U.S. Pat. No. 6,717,230, biased charge control electrodes in a drift region of a FET are employed to provide field shaping within the drift region. In U.S. Pat. No. 6,110,804, floating field conductors are disposed above the top surface of a FET drift region to provide field shaping at the surface of the drift region. Charge is injected onto the floating field conductors (e.g., by biasing the device into breakdown) such that a depletion region is formed in the drift region.

However, these examples of known field shaping approaches also provide examples of undesirable complications that can arise in practice. For example, fabrication of overlapping field plates as in U.S. Pat. No. 6,190,948 can be relatively complicated. Individual biasing of charge control electrodes as in U.S. Pat. No. 6,717,230 can be complicated to implement in practice. In U.S. Pat. No. 6,110,804, the injection of charge onto the floating field conductors can generate practical issues, such as providing the proper amount of injected charge, and dealing with leakage of the injected charge over time.

Accordingly, it would be an advance in the art to provide field shaping having improved performance with structures that can be provided by relatively simple fabrication methods.

SUMMARY

According to the present invention, semiconductor device breakdown voltage can be increased by embedding field shaping regions within a drift region of the semiconductor device. A controllable current path extends between two device terminals on the top surface of a planar substrate, and the controllable current path includes the drift region. Each field shaping region includes two or more electrically conductive regions that are electrically insulated from each other, and which are capacitively coupled to each other to form a voltage divider dividing a potential between the first and second terminals. One or more of the electrically conductive regions are isolated from any external electrical contact. Such field shaping regions can provide enhanced electric field uniformity in current-carrying parts of the drift region, thereby increasing device breakdown voltage.

Some aspects of the present invention can be better appreciated by comparison to an invention of Yang et al. (US 2006/0255401). In US 2006/0255401, a series capacitive structure is vertically disposed in a trench adjacent to a drift region having a vertical controllable current path to increase breakdown voltage. Such a vertical structure tends to require several deposition and etching steps for device fabrication, which can make the fabrication process complicated and difficult to control. Difficulty in controlling process parameters can reduce performance. For example, poorly controlled conductor and dielectric layer thicknesses in the vertical trench can result in RC time delays that degrade device switching performance.

In contrast, the present invention provides a lateral geometry for the field shaping regions. This lateral geometry advantageously simplifies processing, as can be seen in the exemplary fabrication sequences of FIGS. 4a-6c.

BRIEF DESCRIPTION OF THE DRAWINGS

FIG. 1a shows a top view of a device according to an embodiment of the invention.

FIG. 1b shows a cross section view through a field shaping region of the device of FIG. 1a.

FIG. 1c shows a cross section view through an active region of the device of FIG. 1a.

DETAILED DESCRIPTION

Figure 2:
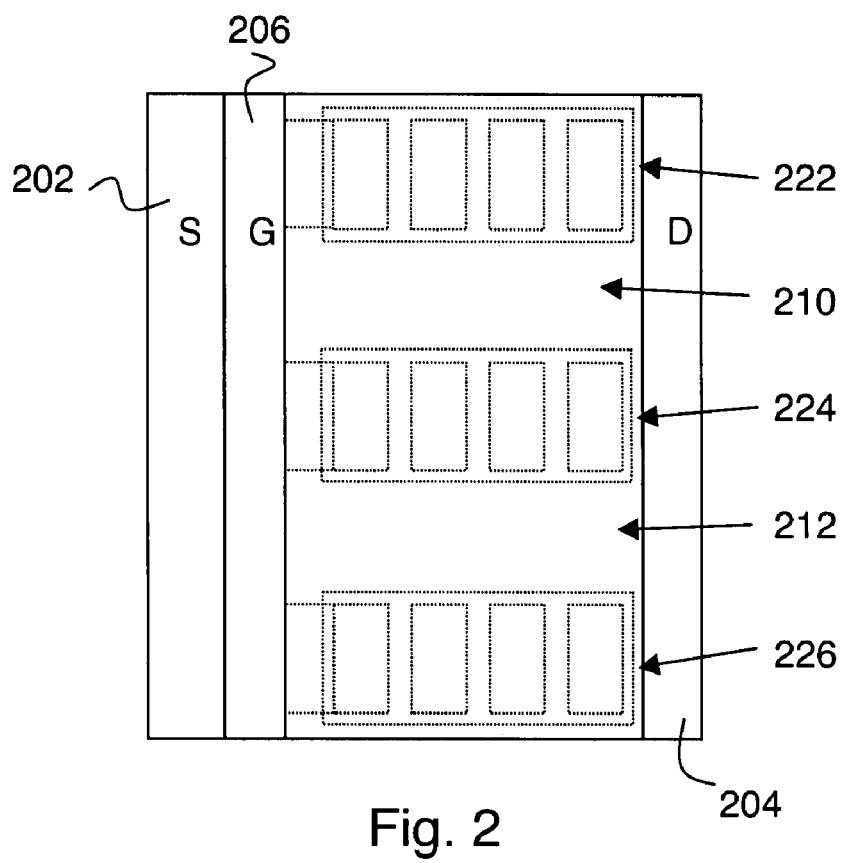
FIG. 2 shows a top view of a device according to another embodiment of the invention.

FIG. 1a shows a top view of a device according to an embodiment of the invention. In this example, current flow between a source 102 and a drain 104 is controlled by a gate 106. Thus the device of this example is a field effect transistor (FET). FIG. 1b shows a cross section view through a field shaping region of the device of FIG. 1a along line AA'. FIG. 1c shows a cross section view through an active region of the device of FIG. 1a along line BB'. To understand the operation of this example, it is helpful to regard the active region (BB', FIG. 1c) as the main part of the device, since this region provides the basic transistor switching functionality.

In the view of FIG. 1c (active region) source 102 and drain 104 are disposed at a top surface of a planar substrate 140, which in this example is p-type silicon. Drain 104 is surrounded by an n-well 130, also of silicon. An insulator 108 (SiOx in this example) is disposed on top of n-well 130 and p-substrate 140. Gate 106 is separated from source 102, n-well 130 and p-substrate 140 by a thin layer of oxide 108. As is well known in the FET art, appropriate biasing of gate 106 can provide or remove a conductive channel extending from source 102 to n-well 130 along the surface of p-substrate 140 under gate 106. Current flow within n-well 130 from the channel to drain 108 is primarily driven by electric fields (as opposed to diffusion), so n-well 130 is referred to as a "drift region".

According to principles of the invention, the electric field distribution in the drift region can be made more uniform by embedding one or more field shaping regions in the drift region. Such increased field uniformity can advantageously increase breakdown voltage. In the example of FIGS. 1a-c, FIG. 1b shows a cross section view through a field shaping region, along line AA' of FIG. 1a. Several electrically conductive regions 110, 112, 114, and 116 (made of polysilicon in this example) are separated from each other and surrounded by oxide 108. For brevity, these electrically conductive regions will be referred to as "plates" in the following description, but practice of the invention does not depend critically on the shape of the electrically conductive regions.

The separation between plates 110, 112, 114, and 116 is selected to provide capacitive coupling between the plates. In this example, plates 112, 114, and 116 are floating (i.e., isolated from any external electrical contact), and plate 110 is connected to gate 106 via a connection 120. More generally, field shaping regions according to embodiments of the invention include two or more conducting plates capacitively coupled to each other within an insulating matrix. At least one of these plates is floating. The floating plates preferably have substantially no net charge. It is possible for all plates to be floating, but it is usually preferred for one of the plates to be connected to the gate, with the remaining plates being floating, as in this example. If the gate is connected to one of the plates, it is preferably connected to the nearest plate in the field shaping region, also as shown in this example.

In addition to being capacitively coupled to each other, the plates are also capacitively coupled to the drift region (i.e., to n-well 130). The most significant effect of this capacitive coupling of the plates to the drift region is on the electric field distribution within the drift region of the active region of the device (e.g., n-well 130 in the view of FIG. 1c). Thus the field shaping region acts "laterally" in the sense that the plates along line AA' affect the field distribution along line BB'. Lateral capacitive coupling of plates 110, 112, 114, and 116 to n-well 130 is provided by disposing the plates in an oxide-filled trench 150, as shown on FIG. 1a.

As indicated above, the capacitive coupling of the plates to each other, and the capacitive coupling of the plates to the drift region, allow electric field non-uniformity to be reduced in the drift region, thereby increasing breakdown voltage. Compositions, dimensions and/or properties of the field shaping regions can be predetermined to provide such increased field uniformity.

Relevant parameters include, but are not limited to: spacings between the plates, composition of the drift region, doping of the drift region, compositions of the plates, dopings of the plates, spacings between the plates and the drift region, compositions of the electrically insulating regions of the field shaping regions, and dielectric constants of the electrically insulating regions of the field shaping regions. Detailed design of appropriate field shaping regions for practicing the invention in connection with any specific device design is within the skill of an ordinary art worker, in view of the principles described herein.

An advantageous feature of the present invention is that critical dimensions, such as plate to plate spacing, and plate to drift region spacing, are lateral dimensions that can be defined lithographically. This advantage is especially pronounced in comparison with the vertical structure of US 2006/0255401, where the plate to plate spacing is a vertical dimension.

Another advantageous feature of the present invention is that embedding the plates in the drift region allows improved plate to plate capacitive coupling and plate to drift region capacitive coupling compared to arrangements where floating plates or rings are disposed on a top surface of a device. Such conventional "surface effect" field shaping arrangements tend to suffer from poor coupling of the floating plates to each other and to the active part of the device. In contrast, plates in embodiments of the invention can have substantially larger capacitive coupling to each other due to their "face to face" geometry, as opposed to the "edge to edge" geometry of a conventional surface effect field shaping arrangement.

Figure 3:
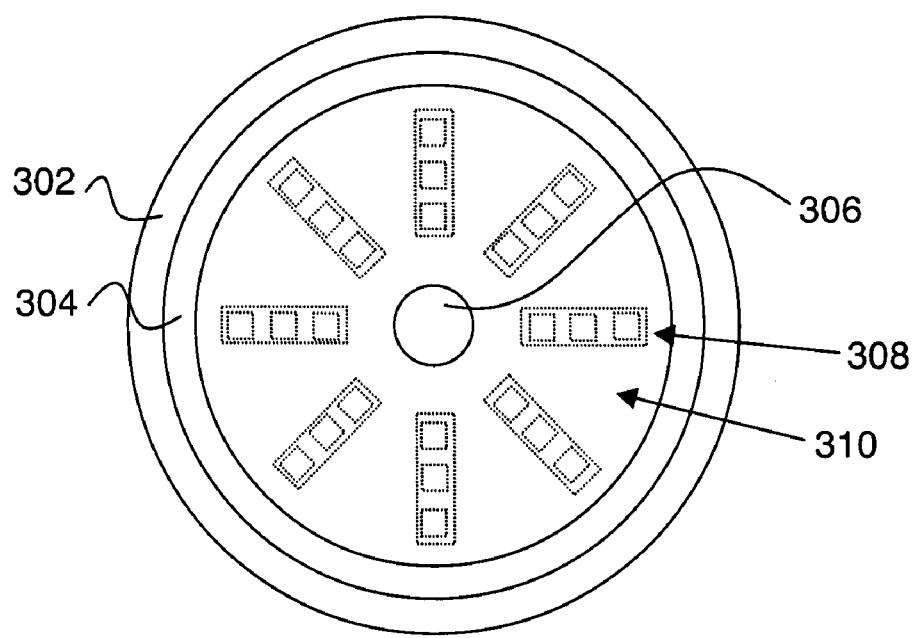
FIG. 3 shows a top view of a device according to a further embodiment of the invention.

As indicated above, it is often helpful to regard devices according to embodiments of the invention as having active regions, where most or all of the current flows, and field shaping regions which serve to control the field distribution in the active regions. The invention can be practiced with various geometrical arrangements of active regions and field shaping regions. For example, FIG. 2 shows a top view of a device having alternating field shaping regions 222, 224, and 226 disposed between active regions 210 and 212. These active and field shaping regions are all part of a drift region between a drain 204 and a gate 206 of a FET having a source 202. As another example, FIG. 3 shows a top view of a device having a drain 306 surrounded by a gate 304 and a source 302, where field shaping regions such as 308 and active regions such as 310 are radially arranged around drain 306.

Fabrication of embodiments of the invention can be regarded as adding fabrication of the field shaping regions to an otherwise conventional process flow. Accordingly, the following exemplary fabrication sequences show process steps for a field shaping region in cross section (e.g., AA' on FIG. 1a).

Figure 4A:
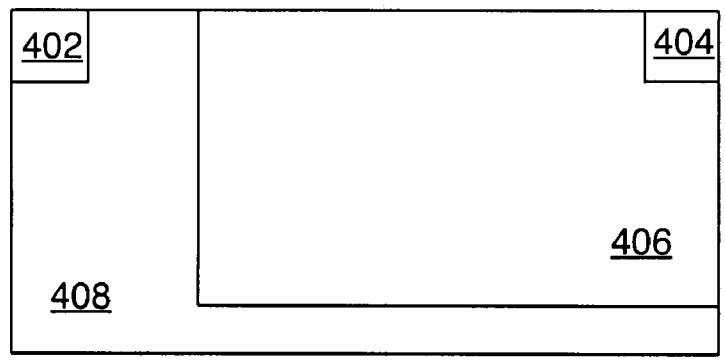
FIGS. 4a-f show a first exemplary device fabrication sequence suitable for fabricating embodiments of the invention.
Figure 4B:
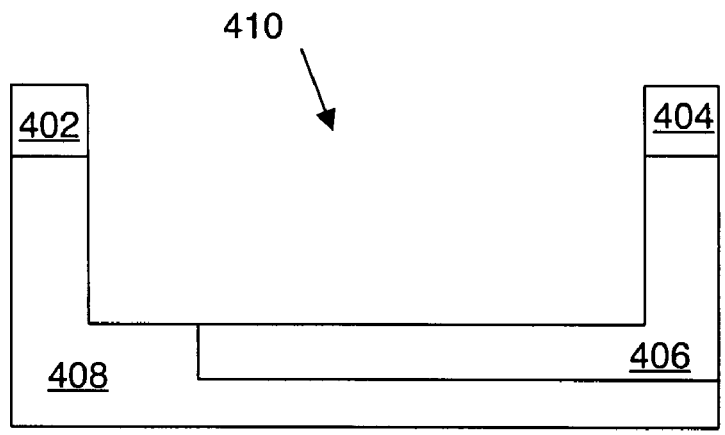
Figure 4C:
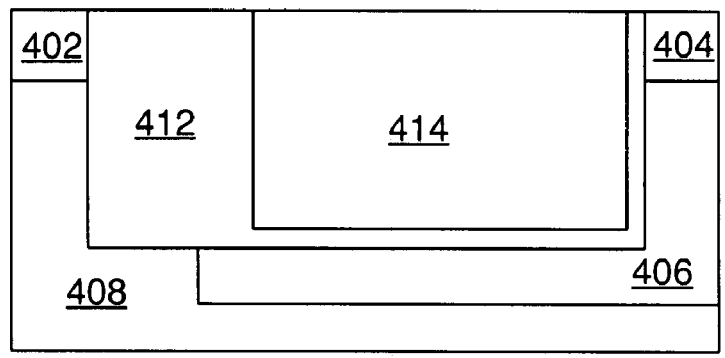

FIGS. 4a-f show a first exemplary device fabrication sequence suitable for fabricating embodiments of the invention. FIG. 4a shows a source 402, a drain 404, an n-well 406 and a p-substrate 408 formed in a semiconductor material. Methods for fabricating such a structure are well known, and need not be described here. FIG. 4b shows the result of etching a trench 410 in the structure of FIG. 4a. Trench 410 is filled sequentially in two steps. The first step is to partially fill trench 410 with oxide 412, and the second step is to fill the remainder of trench 410 with polysilicon 414. FIG. 4c shows the result of these two steps. Oxide 412 can be formed by oxidation of the trench wall material and/or by deposition of oxide. Oxide 412 covers all surfaces of trench 410 (i.e., the bottom surface and all four side surfaces), such that there is no direct physical contact between polysilicon 414 and any surface of trench 410.

Figure 4D:
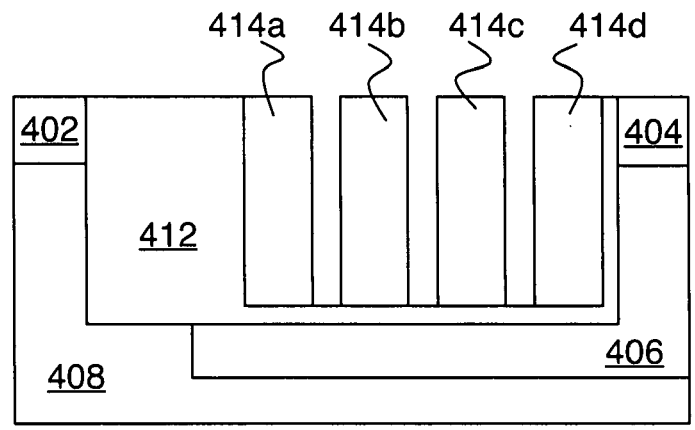
Figure 4E:
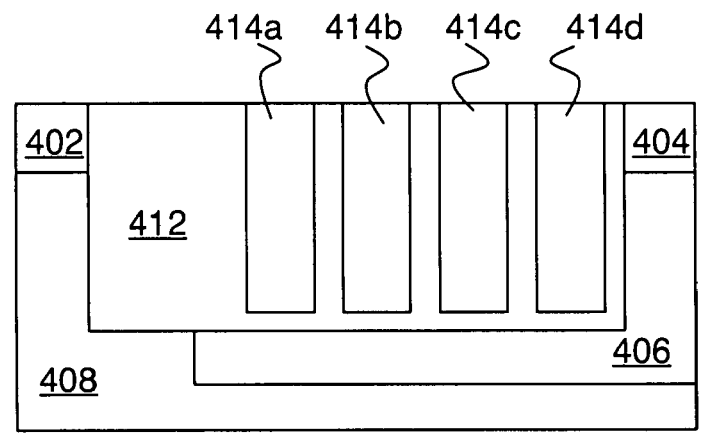
Figure 4F:
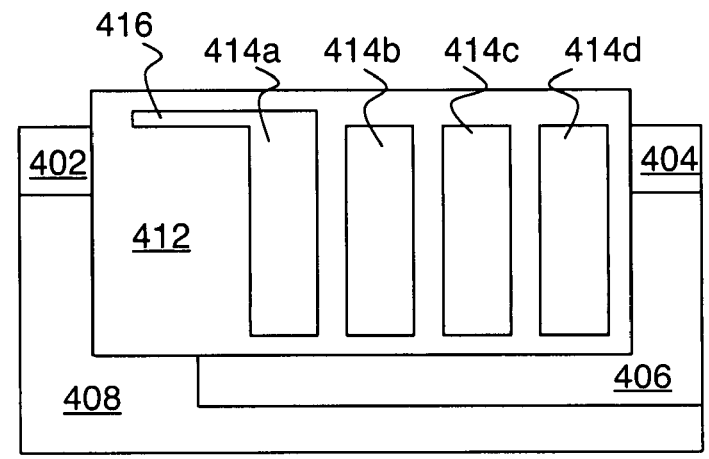

FIG. 4d shows the result of etching polysilicon 414 into several plates, labeled as 414a, 414b, 414c, and 414d. FIG. 4e shows the result of filling in the gaps between the plates with oxide. FIG. 4f shows the result of depositing oxide to cover the top surfaces of the plates, and of providing a polysilicon gate connector 416 connected to plate 414a. Connection of one of the plates to the gate with connector 416 (also shown as 120 on FIG. 1a) can be accomplished with conventional processing methods. The cross section of FIG. 4f is essentially the same as the cross section of FIG. 1b, thereby establishing the sequence of FIGS. 4a-f as one approach for fabricating embodiments of the invention.

Figure 5A:
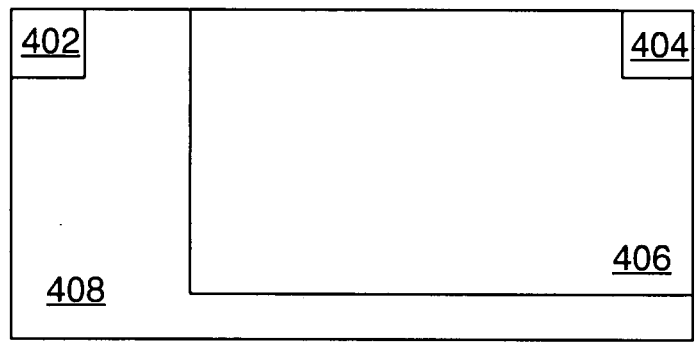
FIGS. 5a-e show a second exemplary device fabrication sequence suitable for fabricating embodiments of the invention.
Figure 5B:
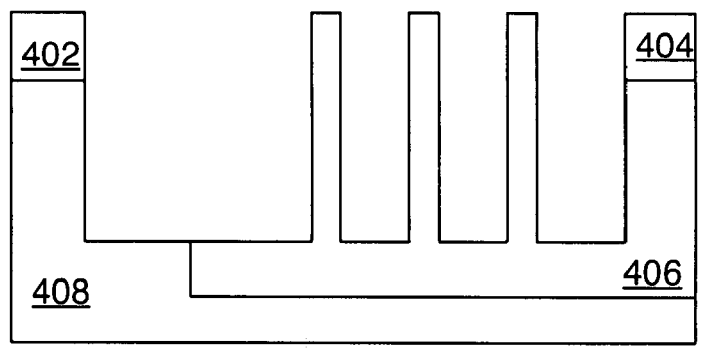
Figure 5C:
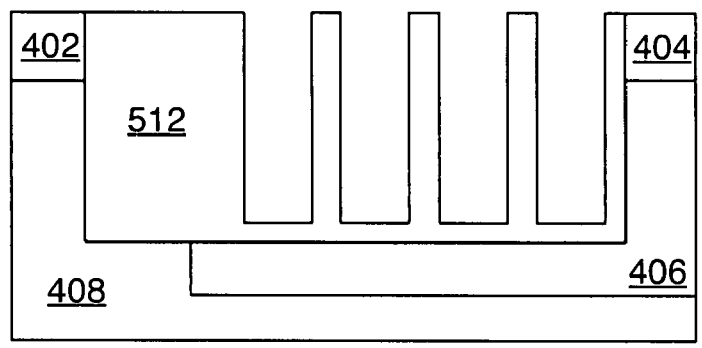
Figure 5D:
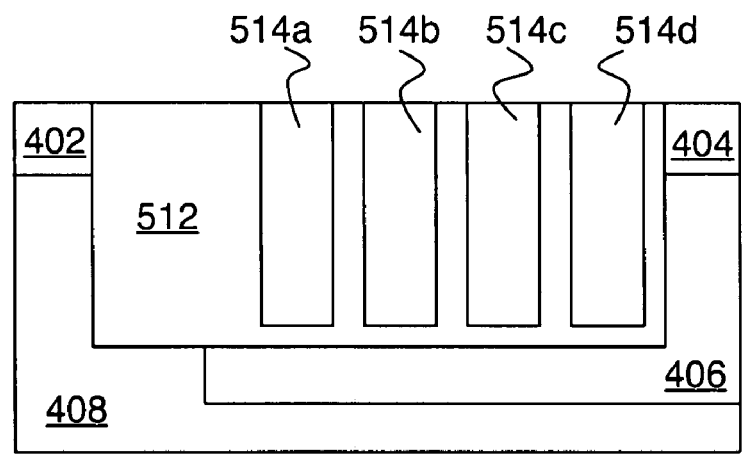
Figure 5E:
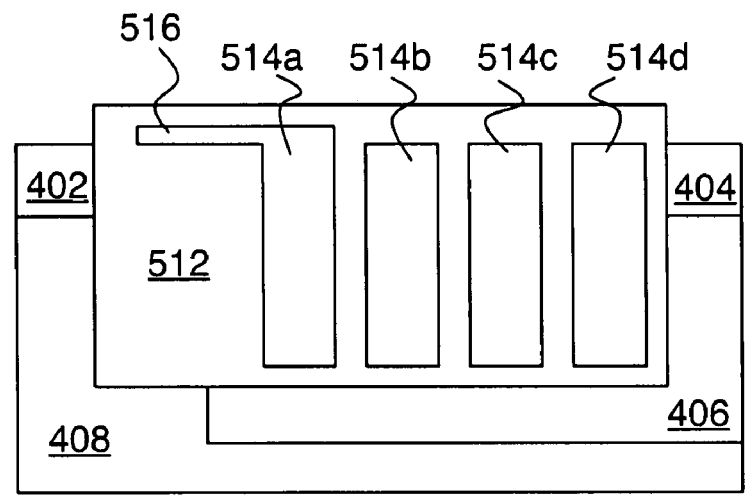

FIGS. 5a-e show an alternate fabrication approach, where oxidation of silicon islands is employed to define the plate to plate separation. FIG. 5a shows the same stating point as FIG. 4a. FIG. 5b shows the result of etching the structure of FIG. 5a to form a trench having semiconductor islands in it. FIG. 5c shows the result of oxidizing the structure of FIG. 5b such that the semiconductor islands are oxidized and become part of oxide 512. Deposition of oxide may also be employed at this step (e.g., to deposit thicker layers of oxide than can readily be obtained by oxidation). FIG. 5d shows the result of depositing polysilicon in the recesses of oxide 512, thereby forming polysilicon plates 514a, 514b, 514c, and 514d. FIG. 5e shows the result of depositing oxide to cover the top surfaces of the plates, and of providing a polysilicon gate connector 516 connected to plate 514a. Here also, the structure of FIG. 5e is essentially that of FIG. 1b.

Figure 6A:
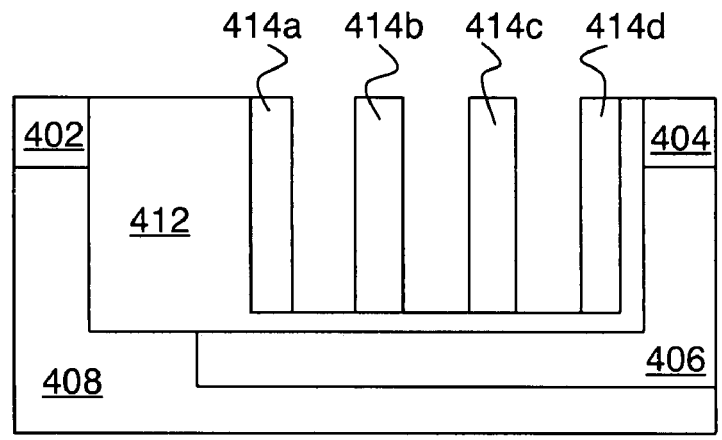
FIGS. 6a-c show a third exemplary device fabrication sequence suitable for fabricating embodiments of the invention.
Figure 6B:
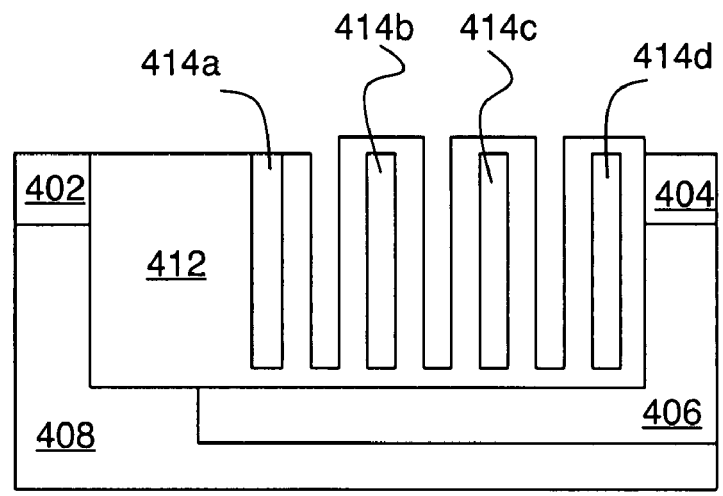
Figure 6C:
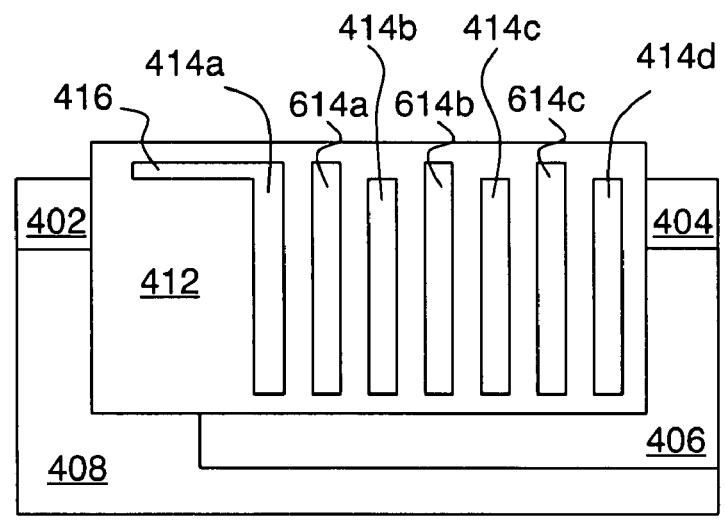

FIGS. 6a-c show another alternate fabrication approach. The approach of FIGS. 6a-c is preferred, since it can provide improved control of plate to plate spacing. FIG. 6a shows a similar structure as in FIG. 4d, where polysilicon plates 414a, 414b, 414c, and 414d have been formed by etching a single polysilicon region. FIG. 6b shows the result of oxidizing the structure of FIG. 6a such that the gaps between the polysilicon plates are not completely filled in. FIG. 6c shows the result of filling the remaining gaps with polysilicon plates 614a, 614b, and 614c, covering the top surfaces of the plates with oxide and providing gate connector 416.

Figure 7:
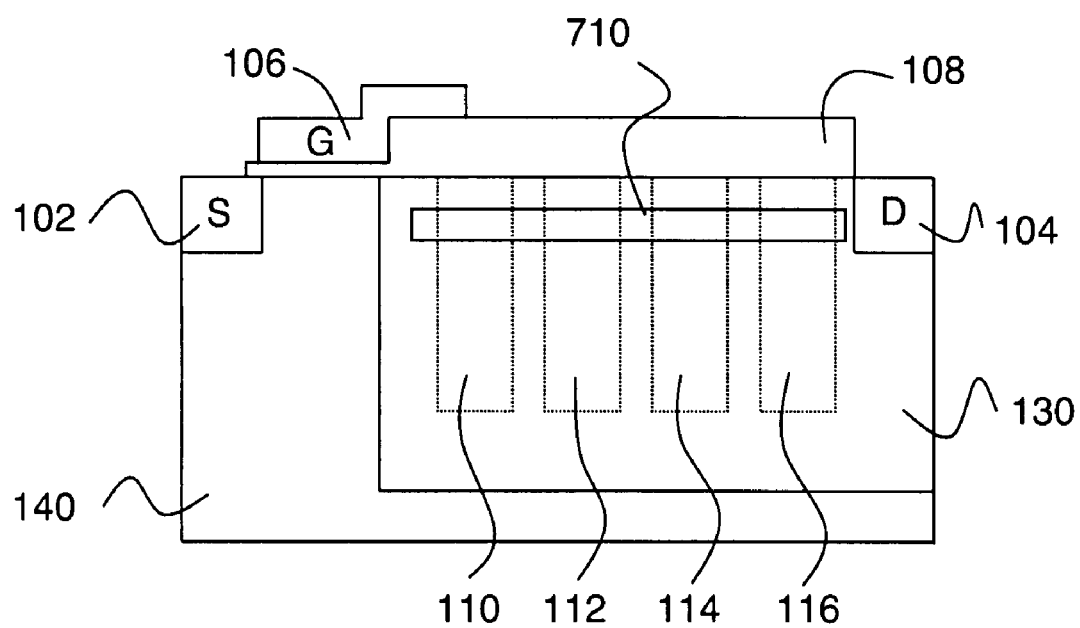
FIG. 7 shows a cross section view through an active region of a device according to an alternate embodiment of the invention.

One of the main advantages of the invention is that field shaping region fabrication methods suitable for practicing the invention tend to be broadly compatible with fabrication of a wide variety of active region device structures. For example, FIG. 7 shows an active region cross section similar to the cross section of FIG. 1c, except that a p-region 710 is added to provide dual conduction. The field distribution within the active region of the example of FIG. 7 can be made more uniform according to the principles of the invention as described above. Furthermore, the presence of p-region 710 in the active region will have no significant effect on fabrication of the field shaping regions.

Consideration of these fabrication methods highlights further advantages of the invention, especially as compared to approaches having vertically stacked plates. In particular, all of the plates of the field shaping regions of embodiments of the invention can be formed in one or two depositions, while vertical approaches can require one deposition step per plate. All of the insulating spacers between plates in embodiments of the invention can also be formed in a single oxidation step, while vertical approaches can require one deposition step per insulating spacer. As a result of these fabrication advantages, embodiments of the invention can readily be designed to provide enhanced field shaping by increasing the number of floating plates.

The surface accessibility of the polysilicon plates can enable further processing for enhanced performance. For example, polycides can be employed to reduce polysilicon resistivity, and multiple resurf can be employed to enhance performance. The lateral geometry of embodiments of the invention facilitates integration, e.g., adding functionality to power integrated circuits (PICs). Such PICs can be employed in various applications, such as switching mode power supplies.

The preceding description has been by way of example as opposed to limitation, and the invention can also be practiced according to many variations of the given examples. For example, the roles of p-type and n-type material can be exchanged in the examples and in any embodiment of the invention. The invention is applicable to any semiconductor device having a controllable current path, including but not limited to: transistors, bipolar transistors, field effect transistors, thyristors, insulated-gate field effect transistors, junction field effect transistors, and MOSFETs. The invention is applicable to any material system suitable for fabricating semiconductor devices, including but not limited to: silicon, group III-V compound semiconductors, group II-VI compound semiconductors, group IV elemental semiconductors, and group IV-IV compound semiconductors.

The invention claimed is:

1. A high voltage semiconductor device comprising:
a first terminal and a second terminal both disposed at a top surface of a planar substrate, wherein a controllable current path extends between said first and second terminals and wherein said controllable current path includes a drift region between said first and second terminals, the drift region comprising;
one or more field shaping regions laterally disposed between said first and second terminals and embedded in said drift region, wherein each of said field shaping regions comprises an electrically insulating region within which is disposed a plurality of electrically conductive regions that are electrically insulated from each other; and
an active region disposed between said first and second terminals and embedded in said drift region, the active region being free of said electrically conductive regions that are disposed in said one or more field shaping regions and the active region being laterally spaced from said one or more field shaping regions;
wherein the one or more field shaping regions are laterally capacitively coupled to the active region; and
wherein each of said field shaping regions is capacitively coupled to each other to form a voltage divider dividing an electric potential between said first and second terminals, wherein one or more of said electrically conductive regions in each said field shaping region are isolated from any external electrical contact.

2. The device of claim 1, wherein compositions, dimensions and properties of said field shaping regions are predetermined to reduce electric field non-uniformity within said drift region by capacitive coupling between said drift region and said electrically conductive regions of said field shaping regions, thereby increasing a breakdown voltage of said device.

3. The device of claim 2, wherein said compositions, dimensions and properties are selected from the group consisting of spacings between said electrically conductive regions within one or more of said field shaping regions, composition of said drift region, doping of said drift region, compositions of said electrically conductive regions, dopings of said electrically conductive regions, spacings between said electrically conductive regions and said drift region, compositions of said electrically insulating regions of said field shaping regions, and dielectric constants of said electrically insulating regions of said field shaping regions.

4. The device of claim 1, wherein said electrically insulating regions of said field shaping regions comprise an oxide of silicon.

5. The device of claim 1, wherein said electrically conductive regions of said field shaping regions comprise polysilicon.

6. The device of claim 1, wherein said first and second terminals comprise a source and a drain of a field effect transistor.

7. The device of claim 1 wherein said isolated electrically conductive regions within said field shaping regions have substantially no net charge.

8. The device of claim 1, wherein one of said electrically conductive regions in one or more of said field shaping regions are electrically connected to a gate terminal of said device.

9. The device of claim 8, wherein each said electrically connected electrically conductive region is disposed closer to said gate terminal than any of said isolated electrically conductive regions of each corresponding field shaping region.

10. A method of increasing semiconductor device breakdown voltage, the method comprising:

providing a first terminal and a second terminal both disposed at a top surface of a planar substrate, wherein a controllable current path extends between said first and second terminals;

providing a drift region between said first and second terminals, the drift region comprising;

one or more field shaping regions laterally disposed between said first and second terminals and embedded in said drift region, wherein each of said field shaping regions comprises an electrically insulating region within which is disposed a plurality of electrically conductive regions that are electrically insulated from each other; and an active region disposed between said first and second terminals and embedded in said drift region, the active region being free of said electrically conductive regions that are disposed in said one or more field shaping regions and the active region being laterally spaced from said one or more field shaping regions;

wherein the one or more field shaping regions are laterally capacitively coupled to the active region; and wherein each of said field shaping regions is capacitively coupled to each other to form a voltage divider dividing an electric potential between said first and second terminals, wherein one or more of said electrically conductive regions in each said field shaping region are isolated from any external electrical contact.

11. A method of fabricating a high voltage semiconductor device, the method comprising:

forming a drift region including an active region and a second region in between a first terminal and a second terminal disposed at a top surface of a planar substrate of said semiconductor device, wherein the active region and the second region are embedded in said drift region and are laterally spaced from each other;

etching one or more trenches in said second region, the trenches being laterally disposed between said first and second terminals and embedded in said drift region;

depositing a conductive material in each trench of said second region to form one or more field shaping regions, wherein each field shaping region comprises a plurality of electrically conductive regions which are electrically insulated from each other, and which are capacitively coupled to each other to form a voltage divider dividing an electric potential between said first and second terminals, wherein one or more of said electrically conductive regions in each said field shaping region are isolated from any external electrical contact;

wherein a controllable current path extends between said first and second terminals, and wherein said controllable current path includes said drift region;

wherein the one or more field shaping regions are laterally capacitively coupled to the active region.

\* \* \* \* \*